(12) United States Patent
Gutierrez-Aitken et al.

(10) Patent No.: US 6,566,724 B1
(45) Date of Patent: May 20, 2003

(54) LOW DARK CURRENT PHOTODIODE

(75) Inventors: Augusto Gutierrez-Aitken, Redondo Beach, CA (US); Edward A. Rezek, Torrance, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 09/742,917

(22) Filed: Dec. 19, 2000

(51) Int. Cl.⁷ .............................................. H01L 33/00
(52) U.S. Cl. ...................................................... 257/458
(58) Field of Search ........................................ 257/458

(56) References Cited

U.S. PATENT DOCUMENTS

| | | | |
|---|---|---|---|
| 5,023,686 A | * | 6/1991 | Helmut et al. |
| 5,073,809 A | * | 12/1991 | Bigan et al. |
| 5,107,319 A | * | 4/1992 | Lauterbach et al. |
| 5,753,960 A | * | 5/1998 | Dickmann |

* cited by examiner

*Primary Examiner*—Stephen D. Meier
(74) *Attorney, Agent, or Firm*—McAndrews, Held & Malloy, Ltd.

(57) ABSTRACT

A low dark current photodiode and a method for reducing dark current in a photodiode. A preferred embodiment of the present invention provides a photodiode comprising a barrier layer. The barrier layer comprises a barrier layer material having a wider band-gap than the band-gap of the absorption layer material of the photodiode. The barrier layer comprises sublayers, which are doped to position the high-electric field region at the pn junction of the photodiode in the barrier layer. The method for reducing dark current in a photodiode comprises building a barrier layer into the structure of a photodiode. Building the barrier layer comprises building a layer of semiconductor material with wider band-gap than the i-layer material. Building the barrier layer preferably further comprises doping the barrier layer material to position the high-energy region at the pn junction of the photodiode in the barrier layer, thus reducing dark current.

7 Claims, 5 Drawing Sheets

LOW DARK CURRENT PHOTODIODE

BACKGROUND OF THE INVENTION

The present invention relates generally to optical semiconductor devices, and more specifically, the present invention relates to a photodiode with low dark current.

Optical communication systems utilize light energy to carry information. To interface optical communications with electronic devices, the information contained in the light energy must be extracted and converted into an electrical signal. Optical-to-electrical conversion circuits, such as photo-receiver circuits, provide this conversion.

Photo-receiver circuits commonly utilize photodiodes. Photodiodes are semiconductor devices that adjust their conductance (or resistance) in accordance with the amount and type of light energy they receive. Ideally, when a photodiode absorbs a relatively high amount of light, it conducts electricity freely, and when a photodiode absorbs relatively little light, it conducts electricity poorly. Photodiodes are typically combined with electrical signal amplification circuitry, such as a heterojunction bipolar transistor ("HBT") amplifier, to amplify an electrical signal produced using the photodiode. Thus, the information carried in the light energy is converted to corresponding information in an electrical signal.

Present photodiodes, however, are not ideal. In particular, they suffer from a non-zero conductance when receiving no light energy. In other words, even when the photodiode is exposed to no light energy, present photodiodes allow a small current to flow. The current that flows when the photodiode is not exposed to light energy is referred to as the dark current. Hence, a photo-receiver incorporating photodiodes produces an output electrical signal, substantially comprising noise, in the absence of input light energy.

Several techniques have been tried in the past to reduce the dark current. As one example, dielectric materials, such as silicon dioxide or silicon nitride, were used for surface passivation. In the surface passivation process, the exposed surfaces of the photodiode are coated with the dielectric material to protect the semiconductor surface and to make the surface less electrically active.

A problem with many surface passivation techniques is that they are not generally compatible with the HBT production process. For example, passivating with organic materials, such as polymide, has been found to reduce dark current. However, passivating with such organic materials typically involves curing the materials at high temperatures. The high temperatures may, in turn, damage the surface or the bulk of the HBT devices, resulting in electrical leakage, doping diffusion, and ohmic contact degradation. Another problem with some of the organic passivation materials is that they are hydroscopic and absorb moisture. This moisture, in turn, adversely affects the performance and reliability of the underlying semiconductor devices.

Additional examples of dark current reduction techniques include altering the deposition process used during passivation and performing a special surface cleaning using acid. In general, however, past dark current reduction have focused on treating the surface of the semiconductor material in some way. All of these techniques fail to address the contribution to dark current inherent in the fumdamental structure of the photodiode itself.

Thus, a need has long existed for a photodiode with low dark current. A need has also long existed for a method for reducing dark current in a photodiode that is compatible with the HBT production process.

SUMMARY OF THE INVENTION

Accordingly, it is an object of the present invention to provide a low dark current photodiode. It is also an object of the present invention to provide a method for reducing dark current in a photodiode. It is a further object of the present invention to provide a method for reducing dark current in a photodiode that is compatible with the HBT production process.

One or more of the foregoing objects are met in whole or in part by a preferred embodiment of the present invention that provides a photodiode comprising an absorption layer and a barrier layer. The barrier layer comprises a barrier layer material having a wider band-gap than the band-gap of the absorption layer material. The barrier layer comprises sublayers, which are doped to position the high-electric field region of the photodiode in the barrier layer. Positioning the high-field region of the photodiode in the wide band-gap barrier layer and away from the narrow band-gap absorption layer substantially reduces the flow of dark current through the photodiode.

A preferred embodiment of the present invention provides a method for fabricating a low dark current photodiode. The method comprises building a barrier layer into the structure of a photodiode. Building the barrier layer includes building a layer of semiconductor material with a wider band-gap than the absorption layer material and doping the barrier layer material to position the high-field region of the photodiode in the barrier layer, thus reducing dark current.

DETAILED DESCRIPTION OF THE PREFERRED EMBODIMENT

Figure 1:
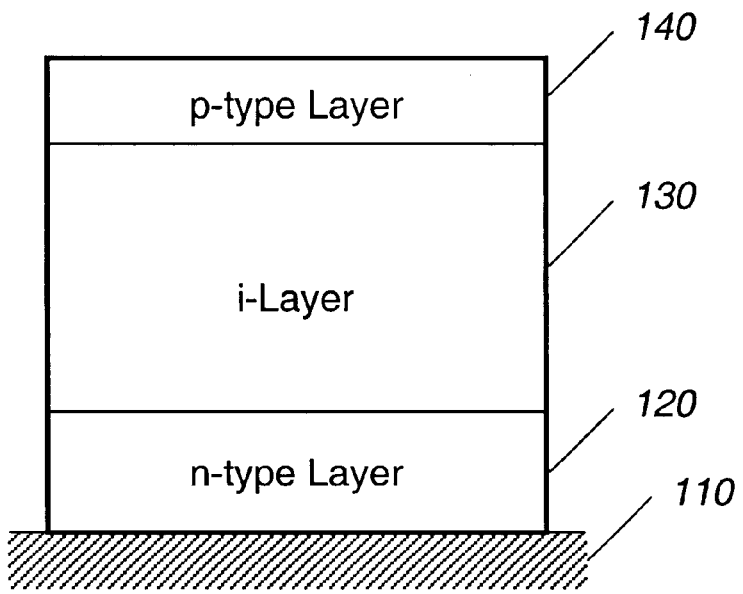
FIG. 1 shows the mesa-structure for a pin photodiode.

FIG. 1 shows the mesa-structure for a pin photodiode 100. The pin photodiode 100 includes a substrate 110, n-layer 120, i-layer 130 and p-layer 140. Typically, the n-layer 120 is grown on top of the substrate 110, the i-layer 130 is grown on top of the n-layer 120, and the p-layer 140 is grown on top of the i-layer 130.

During operation of the pin photodiode 100, charge carriers are generated in the i-layer 130. The amount of light absorbed by the i-layer 130 (also referred to herein as the absorption layer) determines the amount of photocurrent. Hence, the amount of light absorbed by the i-layer 130 controls the amount of current flowing through the pin photodiode 100.

Figure 2:
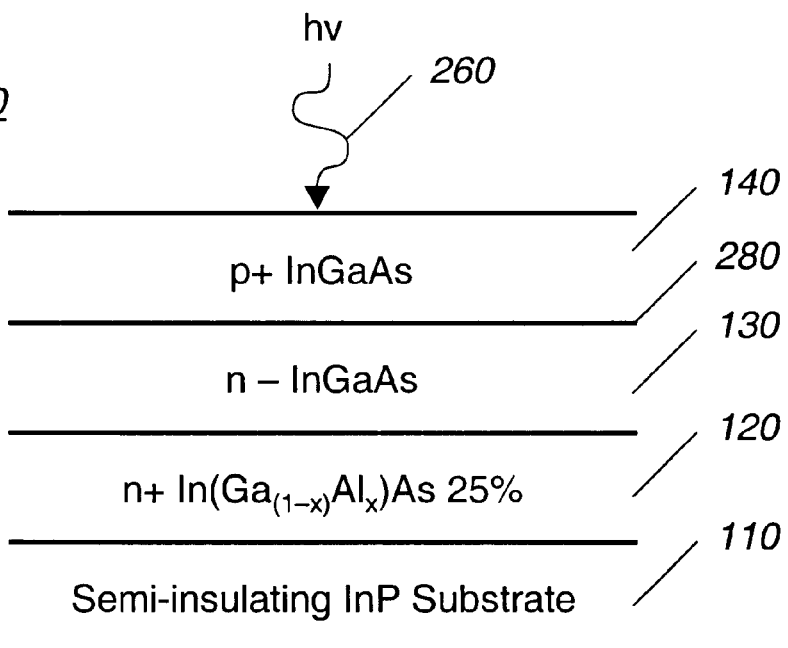
FIG. 2 illustrates the layers of a pin photodiode.

FIG. 2 illustrates a set of material layers for the pin photodiode 100 that includes a high field region near the semiconductor junctions 280. The substrate 110 may comprise a semi-insulating material such as indium phosphide ("InP"). The n-layer 120 n+ material, which is grown on top of the substrate 110, may comprise indium gallium arsenide ("InGaAs") doped negative and lattice-matched to InP. InGaAs is particularly well-suited for the absorption of 1.3–1.55 μm wavelength light. To enhance the performance of the pin photodiode 100, the n-layer 120 n+ material may alternatively comprise a quaternary compound with a wider band-gap, such as indium gallium aluminum arsenide ("In$(Ga_{(1-x)}Al_x)$As") instead of a ternary compound like InGaAs or even an n+ InP layer. One advantage of using In$(Ga_{(1-x)}Al_x)$As or InP instead of InGaAs is that it reduces the amount of light absorbed in the n-layer 120 n+ material, which slows the operation of a pin photodiode 100.

The i-layer 130 n− material, which is grown on top of the n-layer 120 n+ material, may comprise InGaAs doped lightly negative and lattice-matched to InP. The doping may be performed explicitly or may result naturally from the i-layer growing process. The p-layer 140 p+ material, which is grown on top of the i-layer 130 n− material, may comprise InGaAs doped positive and lattice-matched to InP.

In operation, light energy 260 enters the pin photodiode 100 from the top. The light energy 260 passes through the relatively thin p-layer 140 p+ material and is absorbed in the relatively thick i-layer 130 n− material. Photons from the light energy 260 provide the energy necessary for electrons in the i-layer 130 n− material to move from the valence band, where they are confined, to the conduction band, where they are free to flow. This movement of electrons from the valence band to the conduction band enables the flow of electrical current between the n-layer 120 n+ material and the p-layer 140 p+ material through the i-layer 130 n− material.

The term "band-gap" refers to the energy that is required to move an electron from the valence band of a semiconductor to the conduction band. When an electron moves from the valence band to the conduction band, the electron is free to flow. In the i-layer 130 n− material (or "absorption layer material"), the band-gap is relatively small. The i-layer material band-gap is preferably small enough to enable light energy from absorbed photons to cause electrons to jump from the valence band to the conduction band, and thus enabling the flow of electricity between the p-layer 140 and the n-layer 120 through the i-layer 130.

A semiconductor device comprising a positive (or p) region and a negative (or n) region has a high field region (a region of relatively high electric field strength) near the junction of the p and n regions (or layers). For example, in a pin photodiode such as that illustrated in FIGS. 1 and 2, the i-layer 130 n− material is doped lightly negative. Therefore, a high field region 280 exists near the junction of the i-layer 130 n− material and the p-layer 140 p+ material. In semiconductor materials with relatively narrow band-gaps, relatively high electric fields generally cause electrons to jump from the valence band to the conduction band. Since the i-layer 130 n− material has a relatively narrow band-gap, the high field region 280 between the p-layer 140 p+ material and the i-layer 130 n− material causes electrons to jump from the valence band to the conduction band, thus enabling electric current to flow through the i-layer 130 n− material even in the absence of light energy 260. This current contributes substantially to the amount of dark current flowing through the pin photodiode.

Figure 3:
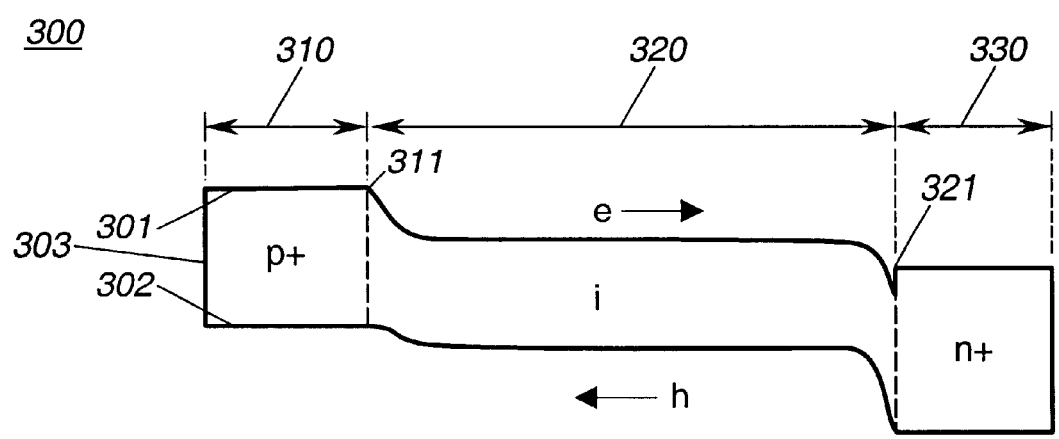
FIG. 3 shows an energy level diagram for a pin photodiode.

FIG. 3 shows an energy level diagram 300 for the pin photodiode 100. The top line represents the conduction band energy level 301, and the bottom line represents the valence band energy level 302. The band-gap 303 is the distance between the conduction band energy level 301 and the valence band energy level 302. The energy level diagram 300 includes a p+ region 310, an i n−region 320, and a n+ region 330. The energy level diagram also shows a pn junction 311 between the p+ region 310 and the i n− region 320, and a nN junction 321 between the i n− region 320 and the n+ region 330.

The p+ region 310 corresponds approximately to the p-layer 140 and p-layer p+ material shown in FIGS. 1 and 2 respectively. The i n− region 320 corresponds approximately to the i-layer 130 and i-layer n− material shown in FIGS. 1 and 2 respectively. The n+ region 330 corresponds approximately to the n-layer 120 and n-layer n+ material shown in FIGS. 1 and 2 respectively.

Traversing the energy level diagram 300 left-to-right, the energy levels 301, 302 are relatively constant in the p+ region 310, because the p-layer 140 p+ material is heavily doped. At the pn junction 311, there is no immediate shift in energy levels 301, 302, because, in this example, there is continuity of fundamental material (and thus, band-gap) between the p-layer 140 p+ material in the p+ region 310 and the i-layer 130 n− material in the i n− region 320. In the present example, the p-layer 140 p+ material and the i-layer 130 n− material comprise InGaAs, but the layers 130, 140 are doped differently. Since, the i-layer 130 n− material corresponding to the i n− region 320 is only doped lightly negative, there is a decay in the energy levels 301, 302 across the i n− region 320. At the nN junction 321, thereis a jump in energy levels 301, 302, because, in this example, the i-layer 130 n− material (InGaAs) and the n-layer 120 n+ material (In$(Ga_{(1-x)}Al_x)$As) have different band-gaps. The n-layer 120 n+ material is heavily doped, so the energy levels 301, 302 are relatively constant across the n+ region 330.

In operation, as photons are absorbed in the i-layer 130, charge carriers (electrons and holes) are created, which carry electrical current between the n-layer 120 and the p-layer 140. In the energy level diagram 300, the electrons ("e") flow to lower energy levels, and thus from left to right across the i n− region 320. Conversely, the holes ("h") flow to higher energy levels, and thus from right to left across the i n− region 320. In the absence of light energy, no photons are absorbed in the i-layer 130, so no charge carriers are created by light. However, there is a relatively high electric field near the pn junction 311. This high field creates charge carriers in the relatively low band-gap i-layer 130 n− material. These charge carriers enable the flow of electric current ("dark current") through the i n− region 320 in the absence of light energy absorption in the i-layer 130 n− material.

Figure 4:
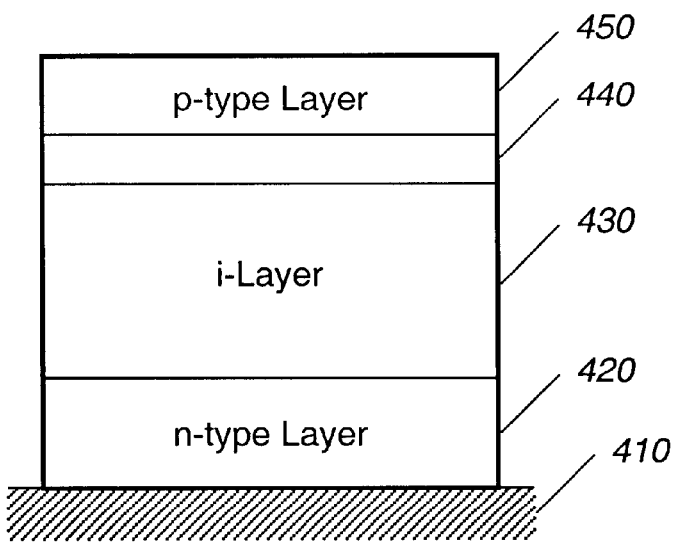
FIG. 4 shows the mesa-structure for a pin photodiode including a barrier layer.

A preferred embodiment of the present invention provides a barrier layer between the absorption layer and adjacent oppositely-doped material as shown. The barrier layer may, for example, be disposed between the i-layer and p-layer of a pin photodiode as shown in FIG. 4. The barrier layer may, for example, alternatively be disposed between the i-layer and the n-layer of a pin photodiode with a change in barrier layer and i-layer doping.

FIG. 4 illustrates the mesa structure for a pin photodiode 400 comprising a substrate layer 410, a n-layer 420, an i-layer 430, a barrier layer 440, and a p-layer 450. The pin photodiode 400 includes a barrier layer 440 disposed between and adjacent to the i-layer 430 and the p-layer 450. The barrier layer 440 positioned in this manner acts as a hole barrier, and may accordingly also be referred to herein as the "hole barrier layer 440." The pin photodiode 400 also includes a n-layer 420 disposed between and adjacent to the substrate layer 410 and the i-layer 430.

Figure 5:
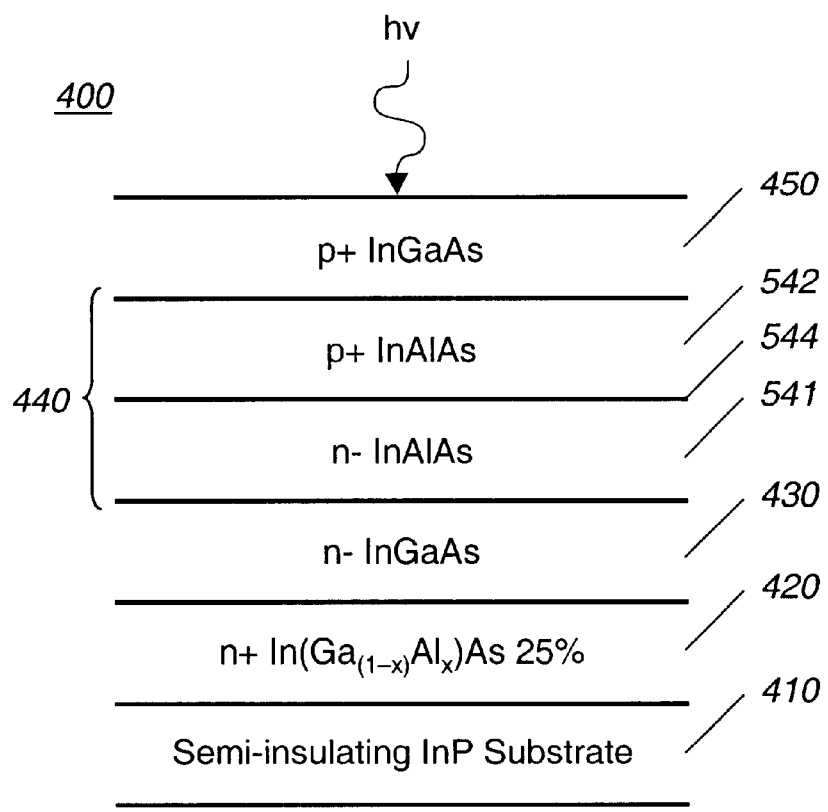
FIG. 5 illustrates the layers of a pin photodiode including a barrier layer.

FIG. 5 illustrates the material layers of the pin photodiode 400 including a hole barrier layer 440 that includes a n-barrier sublayer 541, a p+ barrier sublayer, and a pn junction 544. The semi-insulating substrate layer 410 may, for example, comprise InP. The n-layer 420 n+ material is grown adjacent to the substrate layer 410. The n– layer 420 n+ material may comprise, for example, In(Ga$_{(1-x)}$Al$_x$)As doped negative and lattice-matched to InP {0.53 In, 0.35 Ga, 0.12 Al}. The thickness of the n-layer 420 n+ material may be approximately 0.4 microns. The n-layer 420 n+ material may alternatively comprise InGaAs doped negative and lattice-matched to InP {0.53 In, 0.47 Ga}, or InP doped negative.

The i-layer 430 n– material is grown adjacent to the n-layer 420 n+ material. The i-layer 430 n– material may, for example, comprise InGaAs doped lightly negative and lattice-matched to InP{0.53 In, 0.47 Ga}. The thickness of the i-layer 430 n– material may be approximately 1.0 micron.

The hole barrier 440 material is grown adjacent to the i-layer 430 n– material. The hole barrier 440 material may comprise indium aluminum arsenide (InAlAs) lattice-matched to InP {0.52 In, 0.48 Al}. The thickness of the hole barrier 440 material may be, for example, 200–500 angstroms. The thickness of the hole barrier 440 material may be reduced to enhance the frequency response characteristics of the pin photodiode 400. The band-gap of the InAlAs hole barrier 440 material is greater than the band-gap of the InGaAs i-layer 430 material. The hole barrier layer 440 may alternatively comprise InP.

The hole barrier 440 material is preferably grown adjacent to the i-layer 430 material in two sublayers. First, the N– barrier sublayer 541 is grown adjacent to the i-layer 430 material. The n– barrier sublayer 541 is doped lightly negative. This light negative doping may be accomplished by conventional doping with a negative dopant or by a light negative doping effect inherent in the layer growing (or deposition) process. Next, the p+ barrier sublayer 542 is grown adjacent to the n– barrier sublayer 541. The p+ barrier sublayer 542 may comprise InAlAs doped positive and lattice-matched to InP {0.52 In, 0.48 Al}. The thickness of the hole barrier 440 material may be divided approximately equally between the n– barrier sublayer 541 and the p+ barrier sublayer 542. Alternatively, layer 542 may comprise InP doped positive.

The p-layer 450 p+ material is preferably grown adjacent to the hole barrier 440 material. The p-layer 450 p+ material may comprise InGaAs doped positive and lattice-matched to InP {0.53 In, 0.47 Ga}. The p-layer 450 p+ material serves as a contact layer to facilitate attachment of ohmic contacts to the photodiode. The photodiode then undergoes further processing to complete the fabrication of the device. For example, the material layers 410–450 may be etched, and the exposed surfaces of the etched semiconductor devices may be surface passivated.

The barrier layer 440 contains the pn junction 544 between the n-type (n– barrier sublayer 542) and p-type (p+ barrier sublayer) materials. Hence, the high-field region, substantially located near the pn junction 544, is contained in the barrier layer 440 material. The barrier layer 440 material has a wider band-gap than the band-gap of the adjacent i-layer 430 n– material. Since the high-field region is now contained in a wider band-gap material, the high field causes few charge carriers to form. Thus, the pin diode 400 exhibits low dark current.

Figure 6:
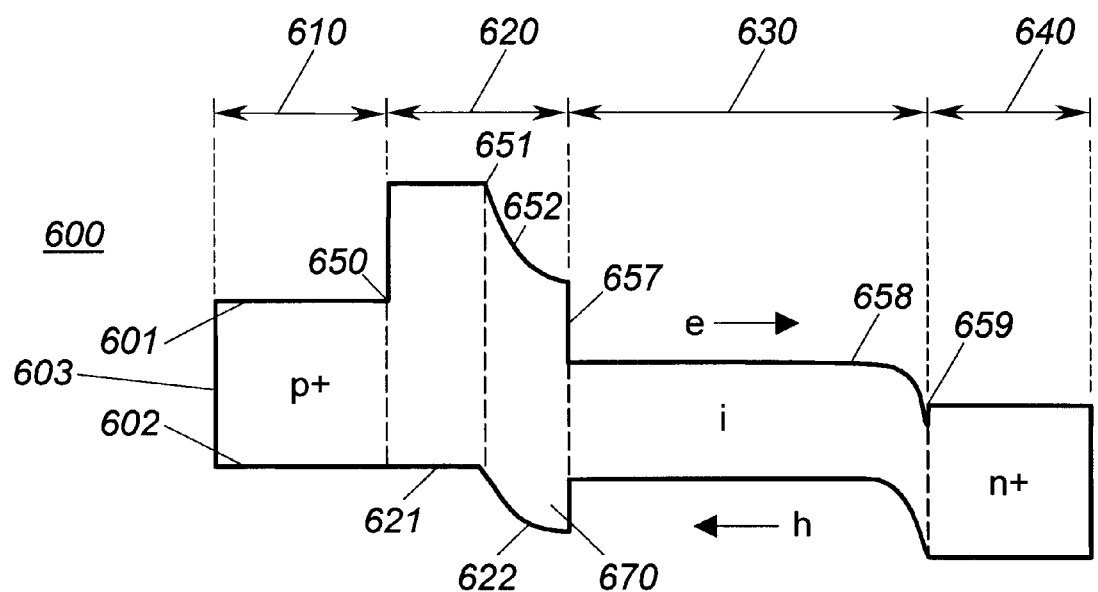
FIG. 6 shows an energy level diagram for a pin photodiode including a barrier layer.

FIG. 6 shows an energy level diagram 600 for the pin photodiode 400. The top line represents the conduction band energy level 601, and the bottom line represents the valence band energy level 602. The distance between conduction band energy level 601 and the valence band energy level 602 is the band-gap 603. The energy level diagram 600 includes a p+ region 610, a barrier region 620, an i n– region 630, and a n+ region 640. The barrier region 620 includes a p+ barrier subregion 621 and a n– barrier subregion 622. The energy level diagram also shows a pP junction 650 between the p+ region 610 and the p+ barrier subregion. 621, a pn junction 651 between the p+ barrier subregion 621 and the n– barrier subregion 622, a Nn junction 657 between the n– barrier subregion 622 and the i n– region 630, and a nN junction 659 between the i n– region 630 and the N+ region 640.

The p+ region 610 corresponds approximately to the p-layer 450 and 450 p+ material shown in FIGS. 4 and 5. The barrier region 620 corresponds approximately to the hole barrier layer 440 and hole barrier 440 material shown in FIGS. 4 and 5. The p+ barrier subregion 621 corresponds approximately to the barrier layer 440 p+ barrier sublayer 542 shown in FIGS. 4 and 5. The n– barrier subregion 622 corresponds approximately to the barrier layer 440 n– barrier sublayer 541 shown in FIGS. 4 and 5. The i n– region 630 corresponds approximately to the i-layer 430 and the i-layer 430 n– material shown in FIGS. 4 and 5. The n+ region 640 corresponds approximately to the n-layer 420 and n-layer 420 n+ material shown in FIGS. 4 and 5.

Traversing the energy level diagram 600 from left-to-right, the energy levels 601, 602 are relatively constant in the p+ region 610 because the p-layer 450 p+ material is heavily doped. At the pP junction 650 between the p+ region 610 and the p+ barrier subregion 621, there is a jump in conduction band energy level 601. The energy level shift is caused by a change in band-gap, which in turn, is due to a change in semiconductor material between the p region 610 and the p+ barrier subregion 621. For example, if the p region 610 corresponds to a p-layer 450 p+ material of InGaAs with a band gap of 0.77 eV (electron volts), and the barrier region 620 corresponds to a hole barrier 440 material of InAlAs with a band-gap of 1.55 eV, the energy level shift will correspond to the difference in band-gap of approximately 0.78 eV. A difference in band-gap between 0.3 eV and 1.0 eV is preferable.

The p+ barrier sublayer 542 is heavily doped, so the energy level across it is relatively constant. The pn junction 651 occurs where the p+ barrier subregion 621 and the n– barrier subregion 622 meet. As mentioned previously, high electric fields generally form at junctions between p and n material. By positioning the high electric field in the barrier region 620, which is formed using a relatively wide band-gap material, dark current is reduced. Traversing the n– barrier subregion 622, the n– barrier subregion 622 is doped lightly negative, which results in a barrier layer decay 652 in both the conduction band energy level 601 and the valence band energy level 602.

There is a jump in energy levels 601, 602 and band-gap 603 at the Nn junction 657 between the n– barrier subregion 622 and the i n– region 630. This energy level shift is caused by a difference in band-gaps between the n– barrier sublayer 541 and the i-layer 430 n– material. Since the i n– region 630 corresponds to material that is preferably doped lightly negative, there is an i-layer decay 658 in energy level 601, 602 across the i n– region 630.

Since there is preferably no material change between the i-layer 430 n– material and the n-layer 420 n+ material (and thus, no change in band-gap), there are no jumps in energy level 601, 602 at the nN junction 659 between the i n– region 630 and the n+ region 640. The n-layer 420 n+ material is preferably doped heavily, so the energy levels 601, 602 are relatively constant across the n+ region 640.

Figure 7:
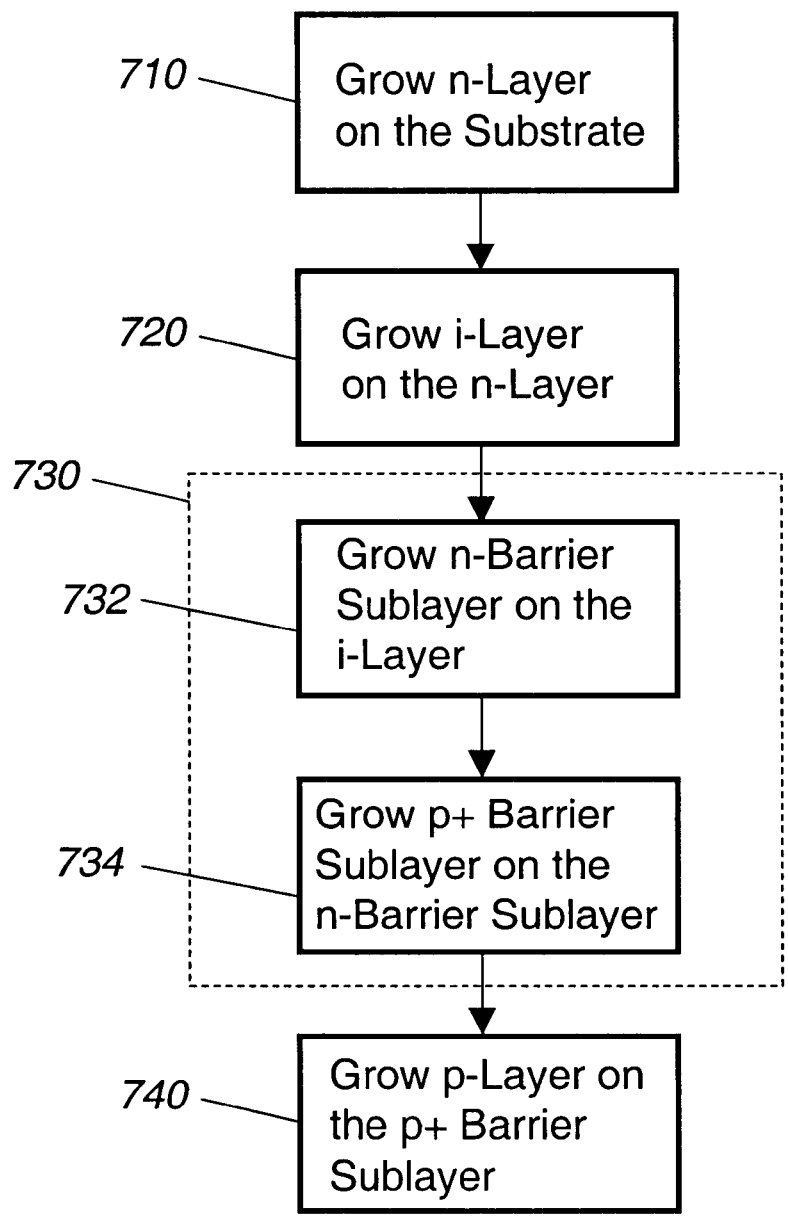
FIG. 7 illustrates a method for fabricating a reduced dark current photodiode.

FIG. 7 illustrates a method 700 for fabricating a reduced dark current photodiode. Although the method 700 refers generally to fabricating a reduced dark current pin photodiode, the method 700 is readily extendible to other types of photodiodes with structures similar to a pin photodiode, such as, for example, avalanche diodes and waveguide diodes.

The method 700 includes growing 710 an n-layer on a substrate. The n-layer is preferably doped negative and lattice-matched to the substrate material. Next, the method 700 grows 720 an i-layer (or "absorption layer") on the n-layer. The i-layer is preferably doped lightly negative and lattice-matched to the substrate.

The method 700 builds 730 a barrier layer in the high-energy region of the photodiode using barrier layer material having a wider band-gap than the i-layer material. Building 730 a barrier layer may, for example, include building the barrier layer between the i-layer and the p-layer. Building 730 a barrier layer between the i-layer and the p-layer may include growing 732 a n– barrier sublayer adjacent to (or on) the i-layer, and growing 734 a p+ barrier sublayer adjacent to (or on) the n– barrier sublayer. The method 700 may grow 740 a p-layer adjacent to the p+ barrier sublayer 740 to complete the structure of the photodiode.

The preferred embodiments of the present invention provide a low dark current photodiode and a method for the fabrication thereof. The low dark current photodiode exhibits a significantly reduced dark current characteristic. The method for fabrication provides a process for the fabrication of photodiodes that exhibit a significantly reduced dark current characteristic, and the method is compatible with the HBT production process.

While particular elements, embodiments and applications of the present invention have been shown and described, it will be understood that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A photodiode comprising:
    a p-layer;
    a n-layer;
    an absorption layer disposed between said p-layer and said n-layer, said absorption layer characterized by an absorption layer band-gap; and
    a barrier layer disposed between said p-layer and said n-layer, said barrier layer characterized by a barrier layer band-gap wider than the absorption layer band gap,
    wherein said absorption layer is disposed adjacent to said n-layer, said absorption layer material is doped n–, and said barrier layer comprises:
        a n– barrier sublayer which is disposed between said p-layer and said absorption layer and adjacent to said absorption layer; and
        a p+ barrier sublayer which is disposed between and adjacent to said N– barrier sublayer and said P-layer.

2. The photodiode of claim 1, wherein said barrier layer comprises InAlAs and said absorption layer comprises InGaAs.

3. The photodiode of claim 1, wherein said barrier layer band-gap is between 0.3 eV and 1 eV higher than said absorption layer band-gap.

4. An improved pin photodiode, the photodiode having a slayer, a n-layer, and an i-layer disposed between the p-layer and the n-layer, the i-layer characterized by an i-layer band-gap, the improvement comprising:
    a barrier layer disposed between the i-layer and one of the n-layer and the Player, said barrier layer characterized by a barrier layer band-gap wider than the i-layer band-gap
    wherein said barrier layer comprises:
        a n– barrier sublayer disposed between the i-layer and the p-layer and adjacent to the i-layer; and
        a p+ barrier sublayer disposed between and adjacent to said n– barrier sublayer and said p-layer.

5. The improved pin photodiode of claim 4, wherein said barrier layer comprise InAlAs and said i-layer comprises InGaAs.

6. The improved pin photodiode of claim 4, wherein said InGaAs and said InAlAs are lattice-matched to InP.

7. An improved pin photodiode, the photodiode having a p-layer, a n-layer, and an i-layer disposed between the p-layer and the n-layer, the i-layer characterized by an i-layer band-gap, the improvement comprising;
    a barrier layer disposed between the i-layer and one of the n-layer and the p-layer, said barrier layer characterized by a barrier layer band-gap wider than the i-layer band-gap
    wherein said barrier layer comprises:
        a first barrier sublayer doped p– and disposed between the i-layer and the n-layer and adjacent to the i-layer; and
        a second barrier sublayer doped n and disposed between and adjacent to said first barrier sublayer and said n-layer.

* * * * *